United States Patent [19]

Dennis

[11] Patent Number: 4,900,279

[45] Date of Patent: Feb. 13, 1990

[54] SOLDER TERMINAL

[75] Inventor: Richard K. Dennis, Etters, Pa.

[73] Assignee: Die Tech, Inc., York Haven, Pa.

[21] Appl. No.: 342,102

[22] Filed: Apr. 24, 1989

[51] Int. Cl.⁴ ............................................. H01R 4/02
[52] U.S. Cl. ...................................... 439/876; 439/83
[58] Field of Search ........................... 439/83, 874, 876

[56] References Cited

U.S. PATENT DOCUMENTS

| 3,324,230 | 6/1967 | Sherlock | 174/84 |
| 3,750,252 | 8/1973 | Landman | 29/191 |
| 4,019,803 | 4/1977 | Schell | 439/876 |
| 4,203,648 | 5/1980 | Seidler | 339/275 |
| 4,679,889 | 7/1987 | Seidler | 439/876 |
| 4,718,863 | 1/1988 | Sadigh-Behzadi | 439/496 |

Primary Examiner—Eugene F. Desmond
Attorney, Agent, or Firm—Thomas Hooker

[57] ABSTRACT

A solder terminal includes a clip adapted to be positioned on one edge of a substrate for forming soldered connections with substrate pads. A leg extends from the clip for forming an electrical connection with a circuit component.

20 Claims, 1 Drawing Sheet

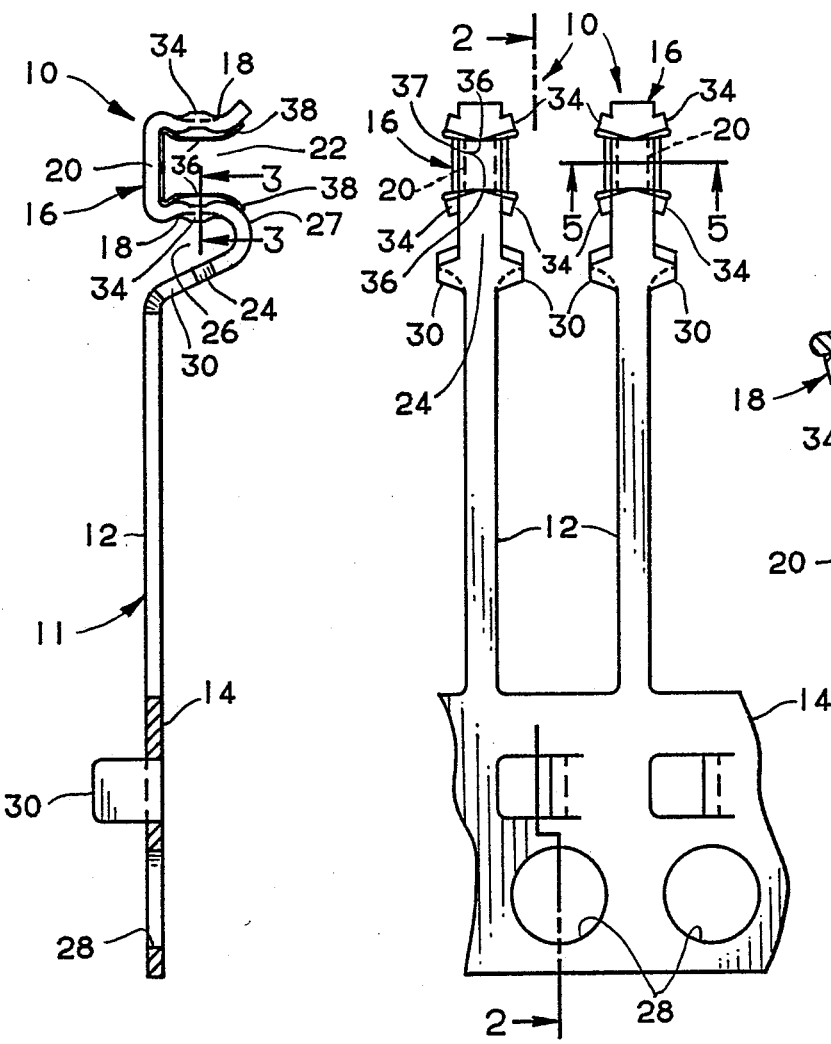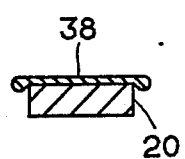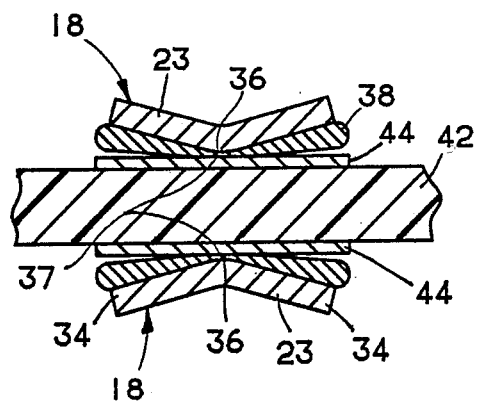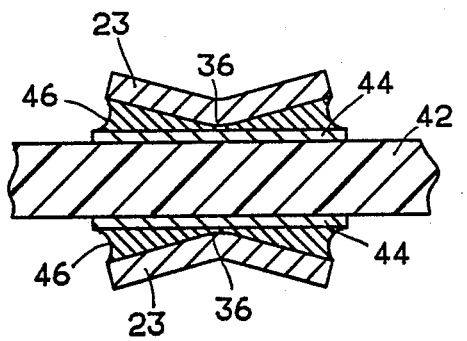

SOLDER TERMINAL

The invention relates to solder terminals, particularly solder clips for forming soldered connections with contact pads on the edges of substrates.

Conventional solder terminals include clips for mounting on the edges of substrates with the interior surfaces of the clips engaging contact pads on the substrate. The clips carry masses of solder remote from the clip-substrate contact such that when the mounted clips are heated the solder melts and must flow a distance to the contact to form a soldered joint. In production applications is difficult to assure that the solder reliably flows to the joint with the result that with this type of terminal there is a risk of forming an unreliable solder joint. Manufacture of these terminals requires forming a solder mass and securing the mass on the terminal. Specialized tooling and production techniques are required.

The present solder terminal is formed from a length of metal stamped from strip stock and includes a C-shaped clip for mounting on the edge of a substrate. The clip has a pair of opposed, like arms on opposite sides of the clip opening with each arm including a base having a central contact ridge facing into the opening and located above the rest of the base. A solder layer is provided on the inner surface of the arm and includes a thin coating overlying the ridge and a solder mass having an increased thickness away from the ridge. The solder overlying the ridge is the high point of the arm, with the solder away from the ridge being located below the thin coating.

The solder terminal is mounted on the substrate by moving the clip over the substrate edge so that the thin solder coating and ridge engage contact pads on the substrate. The substrate has a thickness slightly greater than the spacing between the two solder layers so that the flexible bridge at the back of the clip is stressed slightly to provide a light contact pressure between the arms and the pads, sufficient to hold the clip in place. Following mounting, the clip is heated to melt the solder layers. Capillary action draws the molten solder into the contact areas to form reliable solder fillets extending around the ridges and connecting the arms and the pads. The clip also includes a layer of solder on the bridge adjacent from the arms. Upon melting, this solder is also drawn into both contact areas and forms part of the fillets.

The solder terminals are preferably manufactured from strip stock having a solder inlay layer at the portion of the strip stock forming the clip. In this way, the terminal is manufactured in a simple stamping and forming operation without the necessity of providing a separate solder mass and a mechanism for securing the solder mass to the terminal.

Other objects and features of the invention will become apparent as the description proceeds, especially when taken in conjunction with the accompanying drawings illustrating the invention, of which there is one sheet and one embodiment.

IN THE DRAWINGS

FIG. 1 is a front view of a portion of a carrier strip and two solder terminals;

FIG. 2 is a sectional side view taken along line 2—2 of FIG. 1;

FIGS. 3, 4 and 5 are sectional views taken, respectively, along lines 3—3 of FIG. 2; 4—4 of FIG. 3; and 5—5 of FIG. 1;

FIG. 6 is a sectional view taken through the contact clip of a terminal as mounted on a substrate; and FIG. 7 is a view similar to FIG. 6 shown after forming solder joints between the clip and pads on the substrate.

Solder terminals 10 shown in FIG. 1 and 2 are formed from long, thin strips of metal 11 stamped from strip stock and joined to carrier strip 14. Each terminal includes a leg 12 attached to carrier strip 14 with a C-shaped contact clip 16 at the free end of the terminal. The clip includes a pair of opposed, like contact arms 18 joined together by bridge 20 to form an open substrate receiving-recess 22 between the interior surfaces of arms 18. Each arm has a base 23, formed of strip stock and a solder overlay. The base of the lower arm 18 away from bridge 20 is joined to the upper end of leg 12 by a diagonal strain relief connecting arm 24 extending down to the end of leg 12 and forming an opening 26 between arms 18 and 24. The bottom of opening 26 is defined by the reverse bend 27 at the junction between the arms 24 and 18. Openings 22 and 26 open on opposite sides of the terminal 10. See FIG. 1. The arm 24 is provided with a pair of standoff tabs 30 at the upper end of leg 12 used to support the terminal when leg 12 is inserted into a circuit board hole or similar support.

Carrier strip 14 is provided with a plurality of pilot holes 28 used to move the strip incrementally along a feed path. Alignment tabs 30 shown in FIG. 1 are bent out to one side of the strip and fit in a slot to hold the strip at a proper height in the path.

The terminals 10 are stamp formed from flat strip stock having an integral solder overlay layer bonded to the portion of the stock forming the interior surfaces of the clip 16. For example, the terminal 10 may be manufactured from strip stock having a thickness of about 0.010 inch and carrying an integral solder overlay 38 having a thickness of about 0.004 inch on the side forming the interior of the clip.

During stamping and forming of the terminals from the strip stock the sides 34 and ends of each base 23 are bent down away from central contacts or ridges 36. When the clip is formed the ridges face the opening 22, each extending away from the bridge toward the mouth of the opening. The ridges may be slightly convex. They oppose each other as shown in FIG. 2.

As the clip 16 is formed the solder layer 38 is thinned and extruded away from ridges 36 and beyond the edges of the clip arms as shown. At the ridges 36 the solder layer is reduced to a thickness of about 0.0005 inch, sufficient to provide light solder coatings covering the ridges. As shown in FIGS. 3 and 4, the solder 38 increases in thickness away from the ridge so that a considerable volume of solder is retained on the base, adjacent to the ridges and in contact with the solder on the ridges but at a level below the contact ridges. The solder on the ridges forms the high points of the arms. The solder is continuous with the solder on the inner surface of clip bridge 20. This solder is also coined and extruded beyond the sides of the bridge 20. The arms 18 are bent down from ridges 36 to form corner recesses at the junction between each arm and the bridge and to provide smooth substrate lead ins at the mouth of recess 22.

The contact clip 16 is manufactured with the opposed solder coated contact ridges 36 spaced apart a distance slightly less than the thickness of a substrate 42 inserted into the clip. When inserted, the substrate elastically deforms the bridge so that the insertion force is low yet the arms are resiliently held on the substrate pads 44. The contact pressure between the arms and the substrate is insufficient to scrape off the thin layers of solder overlying contact ridges 36. See FIG. 6 where the thickness of the solder at the ridges is exaggerated. The solder mass 38 on the inner convex surfaces of arms 18 surrounds ridges 36, has a minimum thickness at the ridges and increase in thickness away from the ridges but is below the ridges. Only the thin layers 37 engage pads 44.

The contact ridges 36 are separated from the bridge 20 by corner recesses 40 thereby assuring that the lead end of the substrate does not engage the arms adjacent the base. Such engagement could bend open the clip, reduce the contact pressure between the clip and the substrate and allow the clip to fall off the substrate.

After the clip has been mounted on the substrate as shown in FIG. 6, the clip is heated to melt the solder layer 38 and form solder fillets 46 joining the arms 18 to pads 44 and extending 360 degrees around the contact ridges 36. Capillary action draws the molten solder from the entire inner surface of the clip, including the bridge, to the fillets 46. The solder coined beyond the edges of the clip is drawn into the fillet. The thin solder layer 37 at the ridges assures that solder is reliably drawn to the arm-substrate contact area to form a circumferentially continuous solder joint.

Following soldering of terminals 10 to substrate 42 the terminals are severed from the carrier strip 14. The substrate and terminal assembly may then be mounted on a circuit board, typically by extending legs 12 through holes in the circuit board. Soldered connections may be formed between the legs and holes, conventionally by wave soldering. Alternatively, electrical connections may be formed with the substrate by mounting the substrate--terminal assembly in a connector block and forming connections between contacts in the block and legs 12.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A solder terminal including a contact element and a contact arm joined to the element, the arm having a base with a central contact extending above the base and a solder layer overlying the base, the first solder layer including a thin coating overlying the contact forming the high point of the arm and having an increased thickness away from the contact to provide a mass of solder for forming a soldered joint at the contact when the arm is heated.

2. A solder terminal as in claim 1 wherein the thin coating is about 0.0005 inch thick.

3. A solder terminal as in claim 1 including a solder mass integral with said first solder layer and overlying a part of the terminal immediately adjacent to the base.

4. A solder terminal as in claim 1 wherein the contact comprises a ridge.

5. A solder terminal as in claim 1 wherein the solder layer extends beyond the edges of the base.

6. A solder terminal as in claim 1 including a second contact arm like said previously recited contact arm, a flexible bridge joining the arms with both arms extending in the same direction away from opposite ends of the bridge and with the contacts facing each other to form a C-shaped clip adapted to be mounted on a substrate.

7. A solder terminal as in claim 6 wherein the thin solder coatings are about 0.0005 inch thick.

8. A solder terminal as in claim 7 including a solder layer on the bridge integral with the solder layers on the bases.

9. A solder terminal as in claim 6 wherein said contacts comprises a ridge extending away from the bridge.

10. A solder terminal as in claim 9 wherein said contacts oppose each other.

11. A solder terminal as in claim 6 wherein the contact element comprises a straight leg integral with and extending away from the clip.

12. A solder terminal as in claim 11 including a strain relief arm extending from one end of the leg to an end of a contact arm away from the bridge, said leg and said bridge being generally coplanar.

13. A solder terminal as in claim 11 including alignment tabs extending laterally from opposite sides of the strain relief arm.

14. A solder terminal including a contact leg and a clip at one end of the leg, said clip including a pair of like opposed contact arms each including a base with a contact projection facing the other arm and a body of solder overlying the base, the body of solder including a thin layer extending over the projection and having an increasing thickness away from the projection, said projection forming the high point of the contact arm; and a resilient bridge joining the contact arm bases.

15. A solder terminal as in claim 14 wherein said clip includes a solder mass overlying the bridge and integral with the solder bodies on the contact arms.

16. A solder terminal as in claim 14 wherein said contact projections comprise opposed ridges extending away from the bridge.

17. A solder terminal as in claim 14 including an offset arm extending from one end of a contact arm away from the bridge back along such arm, said leg being joined to said offset arm and extending away from the clip.

18. A solder terminal as in claim 14 wherein the thin layer of each arm is about 0.0005 inch thick.

19. A solder terminal as in claim 18 including a solder mass on the bridge integral with the solder bodies on the arms.

20. A solder terminal as in claim 19 wherein the solder bodies extend beyond the edges of the clip.

* * * * *

UNITED STATES PATENT AND TRADEMARK OFFICE
CERTIFICATE OF CORRECTION

PATENT NO. : 4,900,279

DATED : February 13, 1990

INVENTOR(S) : Richard K. Dennis

It is certified that error appears in the above-identified patent and that said Letters Patent is hereby corrected as shown below:

Column 3, line 54, delete "first".

Column 4, line 2, delete "first".

Signed and Sealed this

Sixteenth Day of November, 1993

Attest:

BRUCE LEHMAN

Attesting Officer

Commissioner of Patents and Trademarks